United States Patent
I-Tsung Pan

[19]

[11] Patent Number: 6,076,723

[45] Date of Patent: Jun. 20, 2000

[54] METAL JET DEPOSITION SYSTEM

[75] Inventor: Alfred I-Tsung Pan, Sunnyvale, Calif.

[73] Assignee: Hewlett-Packard Company, Palo Alto, Calif.

[21] Appl. No.: 09/136,551

[22] Filed: Aug. 19, 1998

[51] Int. Cl.[7] .............................. B23K 1/00; B23K 5/00; B23K 20/08; B23K 31/00; B23K 31/02

[52] U.S. Cl. ........................................ 228/33; 228/180.21

[58] Field of Search ............................... 228/33, 180.21; 347/43; 266/237

[56] References Cited

U.S. PATENT DOCUMENTS

| | | | |
|---|---|---|---|
| 4,821,948 | 4/1989 | Fisher et al. | 228/223 |
| 5,065,932 | 11/1991 | Hayden et al. | 228/55 |
| 5,193,738 | 3/1993 | Hayes | 228/180.2 |
| 5,320,273 | 6/1994 | Goenka et al. | 228/33 |
| 5,328,085 | 7/1994 | Stoops et al. | 228/33 |
| 5,364,011 | 11/1994 | Baker et al. | 228/180.21 |
| 5,415,679 | 5/1995 | Wallace | 75/331 |
| 5,746,368 | 5/1998 | Straub et al. | 228/33 |
| 5,774,145 | 6/1998 | Morita et al. | 347/43 |
| 5,779,971 | 7/1998 | Tsung Pan et al. | 266/237 |

*Primary Examiner*—Patrick Ryan
*Assistant Examiner*—Zidia T. Pittman

[57] ABSTRACT

A metal jet, metal deposition system has metal jets disposed in an oxygen-free chamber. The metal jets eject droplets of a wetting metal onto conductors on an electrical substrate followed by solder metal. Banks of metal jets can be used to print conductors onto the electrical substrate.

20 Claims, 3 Drawing Sheets

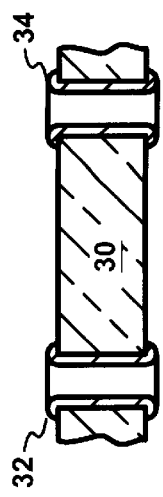
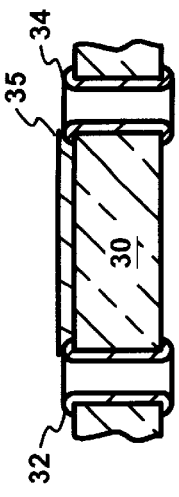
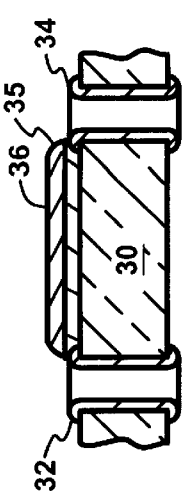
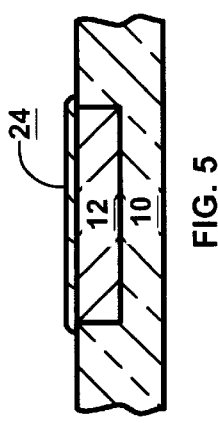
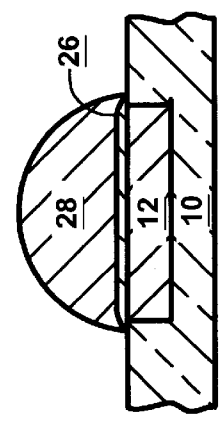
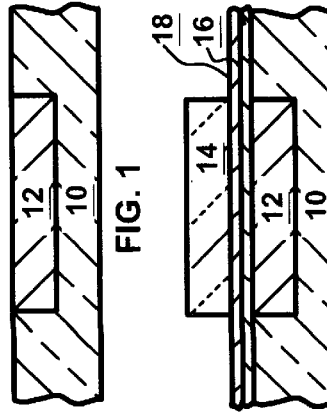
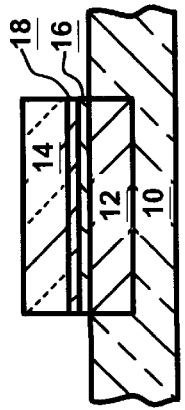
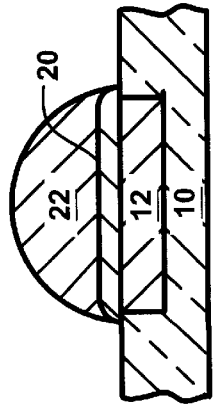

METAL JET DEPOSITION SYSTEM

TECHNICAL FIELD

The present invention relates generally to metal deposition by metal jet printing and more specifically to deposition of solder on conductor-bearing substrates.

BACKGROUND ART

In the past, in order to connect integrated circuits to their packages, a solder bumping process was utilized. In this process, a vacuum sputtering deposition process was used to deposit a wetting metal, such as nickel, on top of the conductor. The wetting metal is necessary to reduce the surface tension of the solder so it will bond to the conductor. After deposition of the nickel, a thin film of oxidation-preventing material, such as gold, was deposited to protect the nickel from being oxidized. When oxidized, the nickel would prevent bonding of the solder to the conductor. After depositing the wetting and oxidation-preventing metals, a photolithographically patterned and developed photoresist was deposited on top over the conductor areas. The exposed areas of the photoresist were then etched away leaving the wetting and oxidation-preventing metals only on the conductor. Besides being relatively complex, the solder bumping process is costly because of the need to use gold.

Similarly, a solder bumping process was used to connect completed integrated circuit packages onto printed circuit boards. Again, a vacuum sputtering process is used to deposit a thin film of nickel on top of the copper. A subsequent sputtering process again deposits gold on top of the nickel to protect the nickel from being oxidized. Again a photoresist is developed with a pattern which covers the conductor area. The non-conductor areas are etched away to the base circuit board. Since printed circuit boards are much larger, this process requires more gold and is extremely expensive.

Since the solder bumping process is complex, time consuming, and expensive, improvements have been long sought but have also long eluded those skilled in the art.

Another seemingly unrelated problem has been that printed circuit boards, themselves, require a number of steps in their manufacture. This means that mass production techniques are the most advantageous and thus printed circuit boards are made the same over large production runs. The concept of individualizing printed circuit boards is almost unimaginable with current processes.

DISCLOSURE OF THE INVENTION

The present invention provides a metal jet, metal deposition system which operates in an inert atmosphere and sequentially deposits a wetting metal followed by solder.

The present invention further provides a metal jet, metal deposition system in which conductive metals may be deposited in a manner analogous to an ink jet printing system.

The present invention has the advantage of eliminating the need for an oxidation-preventing metal being deposited to protect the wetting metal.

The present invention further provides the advantage where a photolithographic masking process is not required in the metal deposition process.

The present invention still further provides the advantage of being able to manufacture individualized printed circuit boards.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a cross-section of a portion of a silicon substrate;

FIG. 2 PRIOR ART is a cross-section of a silicon substrate with a developed photoresist and wetting and oxidation-preventing metals deposited;

FIG. 3 PRIOR ART is a cross-section of a silicon substrate with the wetting and oxidation-preventing metals etched away except under the photoresist;

FIG. 4 PRIOR ART is a cross-section of a silicon substrate with a solder bump;

FIG. 5 is a cross-section of a portion of a silicon substrate with a wetting metal deposited thereon by the present invention;

FIG. 6 is a cross-section of a portion of the silicon substrate with the solder bump of the present invention;

FIG. 7 is a cross-section of a portion of a printed circuit board showing two vias;

FIG. 8 is a cross-section of a portion of a printed circuit board with wetting metal between the two vias;

FIG. 9 is a cross-section of a portion of a printed circuit board with the two vias connected using the present invention by a conductive metal;

BEST MODE FOR CARRYING OUT THE INVENTION

Figure 10:
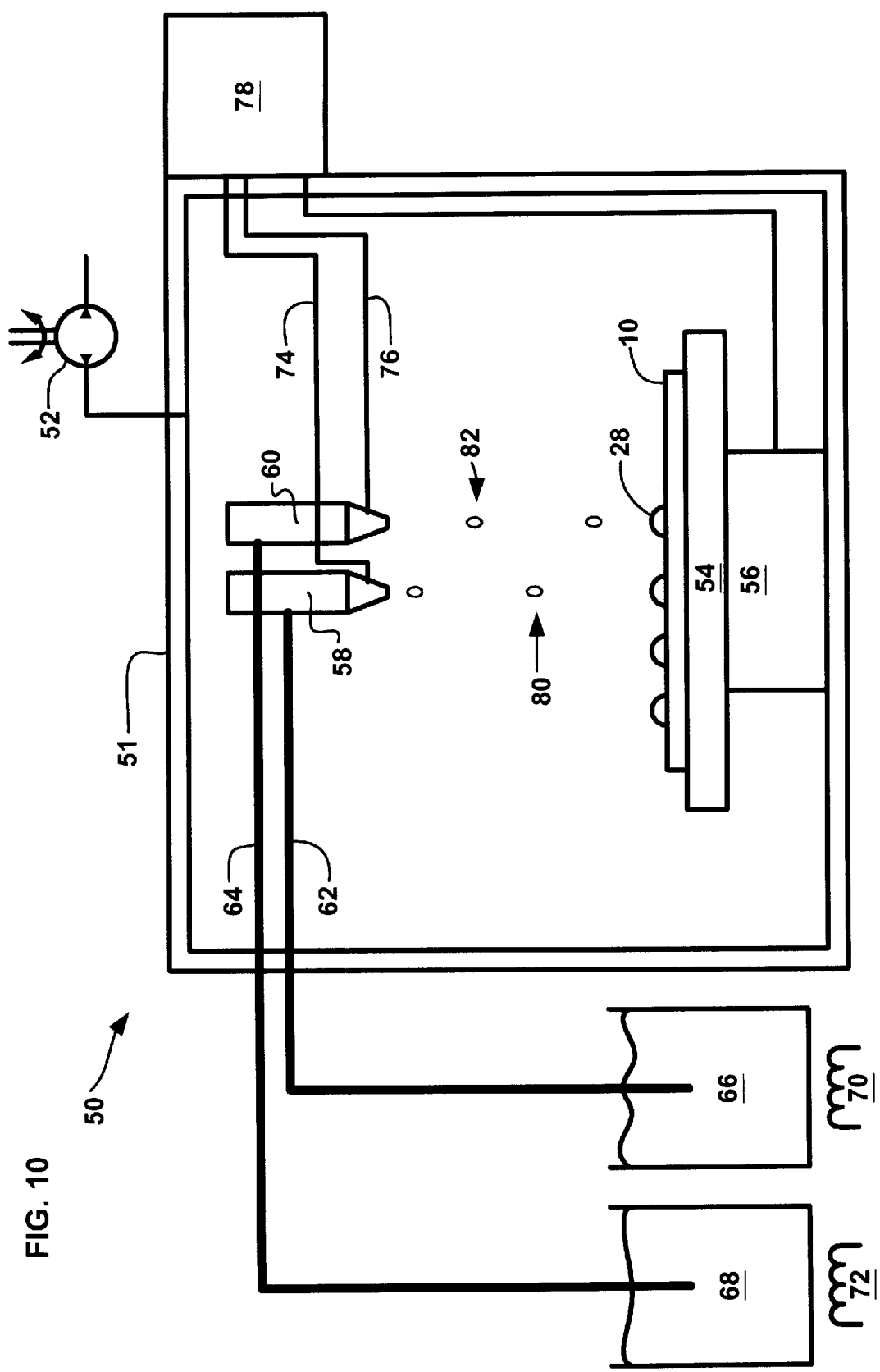
FIG. 10 is a schematic of the present invention depositing soldering bumps upon a silicon substrate.

Referring now to FIG. 1, therein is a shown an electrical substrate, such as a silicon substrate 10, having an inlaid conductor 12. The conductor 12 is generally of aluminum, although copper is now starting to come into use.

Referring now to FIG. 2 PRIOR ART, therein is shown the silicon substrate 10 with a thin film of a wetting metal 16, such as nickel, sputtered onto the silicon substrate 10 and the conductor 12. An oxidation-preventing metal 18 is deposited on top of the wetting metal 16. This oxidation-preventing metal 18 is generally gold. Since the sputtering is done in a vacuum, the gold will prevent the nickel from being oxidized when the silicon substrate 10 is taken out of the vacuum in the sputtering machine. It is known that oxidized nickel will fail to act as a wetting metal.

A photolithographically patterned and developed photoresist 14 masks the wetting metal 16 and the oxidation-preventing metal 18 over the conductor 12. The photoresist 14 can be deposited by a number of different steps, but the most common is by a photolithographic process, which is well known to those skilled in the art. The photoresist 14 has a pattern of openings which exposes the silicon substrate 10 but not the metals over the conductor 12. With the photoresist 14 in place, the oxidation-preventing metal is first etched with one chemical which is metal specific and then the wetting metal 16 is etched with a second chemical which is also metal specific. Both etches are part of the conventional photolithographic process to form the oxidation-preventing metal 18 and wetting metal 16 over the conductor 12.

Referring now to FIG. 3 PRIOR ART, therein is shown the wetting metal 16 and the oxidation-preventing metal 18 after etching, just before removal of the photoresist 14 with a stripping solution.

Referring now to FIG. 4 PRIOR ART, therein is a shown the substrate 10 with the conductor 12 coated by an alloy 20 which is a combination of the wetting metal 16 and the oxidation-preventing metal 18 with a bump of solder metal 22 disposed thereon. The solder metal 22 is generally a tin-lead alloy.

Referring now to FIG. 5, therein is shown the silicon substrate 10 with the inlaid conductor 12 having wetting metal 24. In the present invention, this is the first metal deposition step, and no masking resist 14 is required. The starting point for this process is the same structure shown in FIG. 1.

Referring now to FIG. 6, therein is shown the silicon substrate 10 and the inlaid conductor 12 with the wetting metal alloy 26 which is alloyed to the bump of solder metal 28.

Referring now to FIG. 7, therein is shown a printed circuit board 30 with first and second vias 32 and 34 made of a conductive material. Generally, the vias 32 and 34 are made of copper.

Referring now to FIG. 8, therein is shown wetting metal 35 deposited between the conductor vias 32 and 34.

Referring now to FIG. 9, therein is shown the conductive vias 32 and 34 connected by a conductive line 36.

Referring now to FIG. 10, therein is shown the metal jet, metal deposition system 50 of the present invention. The system 50 includes a chamber 51 having a pump 52 connected thereto. It should be noted that the pump 52 is shown as a reversible pump which can either create a vacuum inside the chamber 51 or be connected to pump an inert gas, such as argon or nitrogen, into the chamber 51 to displace the oxygen.

Inside the chamber 51 is a moveable table 54, which can very precisely move the silicon substrate 10 horizontally in two dimensions.

Also disposed within the chamber 51 are a wetting metal, metal jet 58, and a solder metal, metal jet 60. Both the metal jets 58 and 60 are piezo-electric or electro-magnetic injection devices which operate on a similar principle as ink jet heads in ink jet printers. An example is shown in U.S. Pat. No. 5,779,971 granted on Jul. 14, 1998 to Alfred I. Tsung Pan, Ross R. Allen, and Eric G. Hanson and titled "SOLDER JET PRINTHEAD".

The wetting metal, metal jet 58 and the solder metal, metal 60 are respectively connected by feed lines 62 and 64 to respective molten wetting metal supply 66 and molten solder metal supply 68. The molten wetting metal supply 66 and the molten solder metal supply 68 are kept liquid by heating elements 70 and 72, respectively. The wetting metal, metal jet 58 and the solder metal, metal jet 60 are respectively connected by leads 74 and 76 to a computer control 78 (which are similar to the controls used in an ink jet printer) to control the ejection of microjet wetting metal droplets 80 and microjet solder droplets 82 onto the silicon substrate 10.

Figure 11:
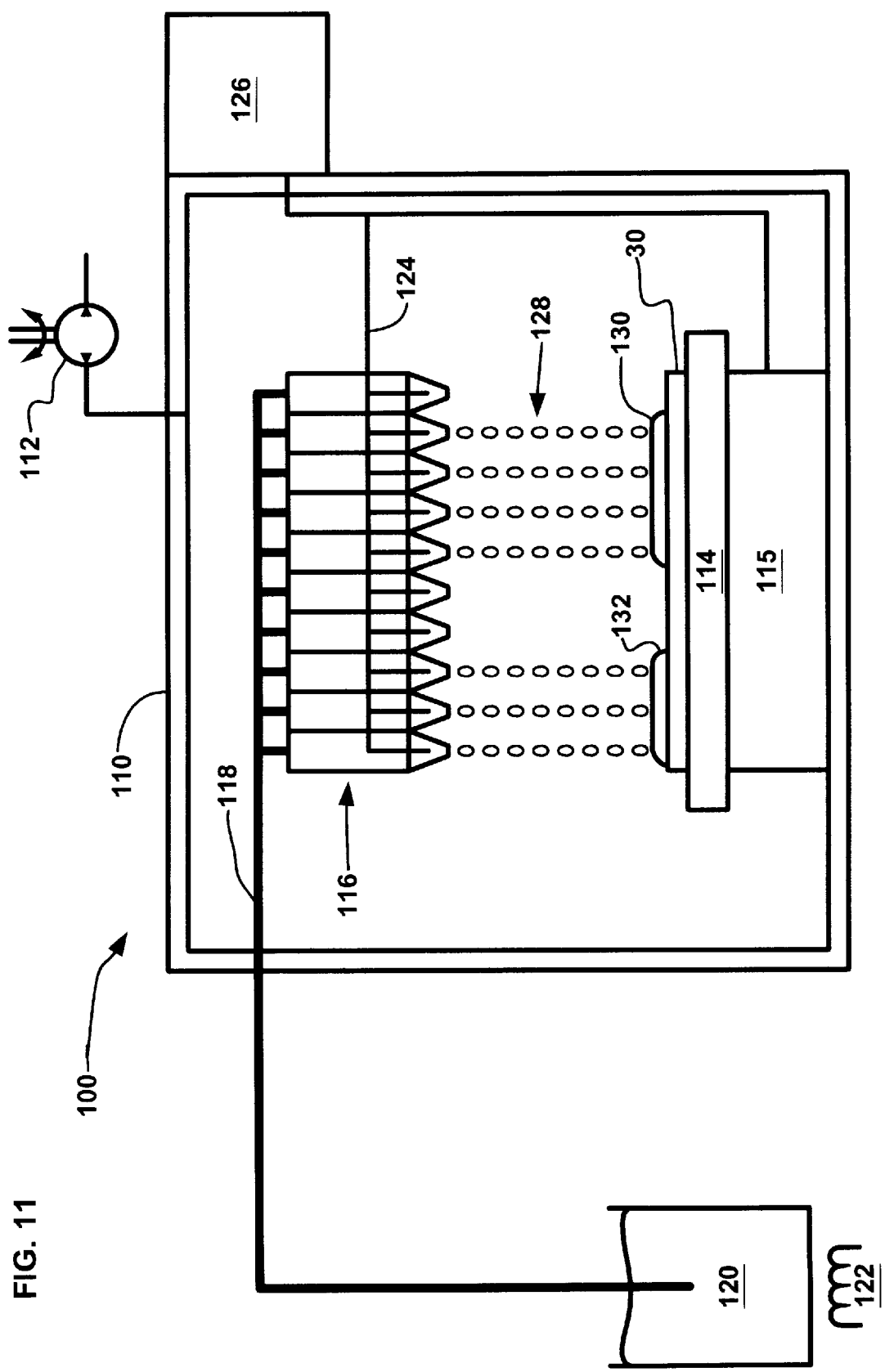
FIG. 11 is a schematic of the present invention depositing conductive lines on a printed circuit board.

Referring now to FIG. 11, therein is shown the metal jet, metal deposition system 100 of the present invention used for putting down conductive lines onto electrical substrates, such as a printed circuit board. The system 100 includes a chamber 110 with a pump 112 which can be a vacuum pump to evacuate the chamber 110 or an inert gas pump for filling the chamber 110 with an inert gas such as argon or nitrogen. In either case, the objective is to remove oxygen from the chamber 110.

The chamber 110 contains a table 114 which is free to move in horizontal directions. The table 114 supports the printed circuit board 30.

The chamber 110 further contains a plurality of metal jets 116, which are positioned across the width of the printed circuit board 30. The metal jets 116 are connected to supply lines 118, which are further connected to a molten metal supply 120 heated by a heating element 122.

The ink jets 116 are controlled by a number of lines generally designated by the numeral 124 which is connected to a computer 126, which is analogous to the control for an inline head ink jet printer. The computer 126 controls the ejection of the metal droplets 128 to form the conductive lines 130 and 132.

In the prior art, the silicon substrate 10 was covered with wetting metal which was sputtered on in a vacuum. While still in the vacuum, the oxidation-preventing metal 18 would also be sputtered on top of the wetting metal 16. A photoresist was deposited on the oxidation-preventing metal 18 and exposed to light using a mask which left a pattern in the photoresist which could be developed to create the photoresist 14.

After the photoresist 14 is formed, the oxidation-preventing metal 18 and the wetting metal would be etched to the configuration shown in FIG. 3 PRIOR ART. Then, drops of solder would be deposited over the oxidation-preventing metal 18 to form the alloy 20 and the bump of solder metal 22 as shown in the FIG. 4 PRIOR ART.

In the present invention, the system 50 in FIG. 10 is used for providing solder bumps on silicon substrates, such as integrated circuit chips or silicon wafers. The silicon substrate 10 is placed on the table 54 in the system 50. The silicon substrate 10 is then moved to a starting position by the actuator 56 that is controlled by the computer 78. The pump 52 is then activated to remove oxygen from the inside of the chamber 51. The pump 52 can remove oxygen from the chamber 51 by drawing a vacuum in the chamber 51 and either maintaining the vacuum or filling the chamber 51 with an inert gas such as argon or nitrogen.

When the oxygen from the chamber 51 has been removed, the computer 78 actuates the wetting metal, metal jet 58 to eject a wetting metal droplet 80. The wetting metal droplet 80 comes from the molten wetting metal supply 66 through the line 62 to the wetting metal, metal jet 58. The computer 78 controls the impact point of the wetting metal droplet 80 to strike the conductor 12 in the silicon substrate 10. In the present invention, tin would be a good wetting agent since it is an excellent reductant and would reduce oxides in the copper conductor.

The actuator 56 will be moving the table 54 on a continuous basis such that immediately after the impact of the wetting metal droplet 80 on the conductor 12, the conductor 12 will be positioned under the solder metal, metal jet 60. Under control of the computer 78, the solder, metal jet 60 will eject a solder droplet 81 to impact on top of the previously deposited wetting metal droplet 80. The solder metal, metal jet 60 is supplied from the molten solder metal supply 78 through the line 64.

Since the metal jets 58 and 60 are capable of producing very fine droplets, the size of the metal buildup on the conductor 12 can be very precisely controlled. Further, as would be evident to those skilled in the art, it would be possible to move the metal jets 58 and 60 while keeping the table 54 stationery.

When using the present invention for the deposition of solder on the printed circuit board 30, the metal jet, metal deposition system 100 would use a plurality of metal jets. As shown in FIG. 11, the chamber 110 would still be connected to pump 112. The table 114 and the actuator 115 would be larger to support the printed circuit board 30. The chamber 110 would contain a plurality of metal jets generally designated by the numeral 116. Each "bank" of metal jets 116 would be connected by a line 118 to liquid material supply 120. Where the material supply 120 must be kept heated, a heating coil 122 would be provided. It should be understood that some materials do not require such a heating coil since they are liquid at operating temperatures of the system 50.

Each bank of metal jets 116 would be controlled through a bundle of lines 124 by the computer 126.

Each of the banks of metal jets 116 would handle a different material. For example, the first bank to be actuated could contain a wetting agent 35 for wetting the conductive vias 32 and 34 on the printed circuit board 30, which are shown in FIG. 9. A second bank of metal jets 116 could be used to dispense a wetting agent 35 for the material of the printed circuit board 30, itself.

A third bank of metal jets 116 would dispose the droplets of conductor 128 which form the printed conductor lines 130 and 132.

As would be evident to those skilled in the art, as the size of the metal jets 116 are reduced in size, it is conceivable that this process could be used to provide conductive lines directly on silicon substrates.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A metal deposition system for conductor bearing substrates, comprising:
   a system for providing a space substantially free from oxygen;
   a first ejection system in said space for a directing a preparatory material to wet the conductor on the substrate; and
   a second ejection system in said space for directing a bonding material to overlay said preparatory material.

2. The system as claimed in claim 1 wherein said system for providing said space fills said space with an inert gas.

3. The system as claimed in claim 1 wherein said first ejection system directs a preparatory material which is reductant for reducing oxides on the conductor.

4. The system as claimed in claim 1 wherein said second ejection system directs a bonding material which is a solder for bonding conductors together.

5. The system as claimed in claim 1 wherein said first and second ejection systems direct microjets of said preparatory and bonding materials to the substrate.

6. The system as claimed in claim 1 wherein the first ejection system has a plurality of microjet heads for providing and directing a plurality of microdrops of said preparatory material to the substrate.

7. The system as claimed in claim 1 wherein the second ejection system has a plurality of microjet heads for providing and directing a plurality of microdrops of said bonding material to the substrate.

8. A metal deposition system for conductor bearing substrates, comprising:
   a system providing a chamber substantially free from oxygen;
   a first ejection system in said chamber for a directing a wetting metal to wet the conductor on the substrate; and
   a second ejection system in said chamber for directing a solder to overlay said wetting metal.

9. The system as claimed in claim 8 wherein said system providing said chamber includes a vacuum pump for evacuating said chamber.

10. The system as claimed in claim 8 wherein said system providing said chamber includes a system for filling said chamber with an inert gas.

11. The system as claimed in claim 10 wherein said inert gas is nitrogen.

12. The system as claimed in claim 10 wherein said inert gas is argon.

13. The system as claimed in claim 8 wherein said first ejection system directs a wetting metal which is reductant for reducing oxides on the conductor.

14. The system as claimed in claim 13 wherein said wetting metal is tin heated past the melting point of tin.

15. The system as claimed in claim 8 wherein said second ejection system directs a solder of a tin-lead alloy heated past the melting point of said alloy.

16. The system as claimed in claim 8 wherein said first and second ejection systems direct liquid microjets of said wetting and solder metals to the substrate in controlled patterns.

17. The system as claimed in claim 8 wherein the first ejection system has a plurality of microjet heads for providing and directing a plurality of liquid microdrops of said wetting metal to the substrate.

18. The system as claimed in claim 8 wherein the second ejection system has a plurality of microjet heads for providing and directing a plurality of liquid microdrops of said solder to the substrate.

19. A solder bumping system for conductor bearing silicon wafers, comprising:
   a system for providing a space substantially free from oxygen;
   a first ejection system in said space for a directing a tin metal to wet the conductor on the wafer; and
   a second ejection system in said space for directing a tin-lead alloy to overlay said tin metal.

20. A conductor application system for conductor bearing printed circuit board, comprising:
   a system for providing a space substantially free from oxygen;
   a first ejection system in said space for a directing a wetting metal to wet the conductor on the printed circuit board; and
   a second ejection system in said space for directing a conductor to overlay said wetting metal and to form conductor lines on said printed circuit board to connect the conductors thereon.

* * * * *